(12) United States Patent
Park et al.

(10) Patent No.: US 9,136,284 B2
(45) Date of Patent: Sep. 15, 2015

(54) THIN FILM TRANSISTOR PANEL AND METHOD FOR MANUFACTURING THE SAME

(71) Applicant: SAMSUNG DISPLAY CO., LTD., Gyeonggi-Do (KR)

(72) Inventors: Sung Kyun Park, Seoul (KR); Jeong Min Park, Seoul (KR); Jung-Soo Lee, Seoul (KR); Jin Ho Ju, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 164 days.

(21) Appl. No.: 13/915,070

(22) Filed: Jun. 11, 2013

(65) Prior Publication Data
US 2014/0183536 A1 Jul. 3, 2014

(30) Foreign Application Priority Data
Jan. 3, 2013 (KR) .................. 10-2013-0000770

(51) Int. Cl.
*H01L 27/12* (2006.01)
*H01L 27/15* (2006.01)

(52) U.S. Cl.
CPC .......... *H01L 27/124* (2013.01); *H01L 27/1222* (2013.01); *H01L 27/1248* (2013.01); *H01L 27/1259* (2013.01)

(58) Field of Classification Search
CPC ................... H01L 27/1259–27/1262; H01L 27/124–27/1248
See application file for complete search history.

(56) References Cited

U.S. PATENT DOCUMENTS

| | | | | |
|---|---|---|---|---|
| 7,411,216 | B2 * | 8/2008 | Kim et al. | 257/72 |
| 8,896,799 | B2 * | 11/2014 | Kwak | 349/153 |
| 8,912,991 | B2 * | 12/2014 | Kim et al. | 345/87 |
| 2003/0133066 | A1 * | 7/2003 | Ono et al. | 349/141 |
| 2003/0189678 | A1 * | 10/2003 | Choi | 349/43 |
| 2006/0023130 | A1 * | 2/2006 | Jeoung et al. | 349/2 |
| 2006/0119758 | A1 * | 6/2006 | Chai et al. | 349/43 |
| 2006/0146242 | A1 * | 7/2006 | Kim et al. | 349/129 |
| 2007/0023760 | A1 * | 2/2007 | Kim et al. | 257/72 |
| 2007/0046847 | A1 * | 3/2007 | Lee et al. | 349/43 |
| 2007/0109457 | A1 * | 5/2007 | Song et al. | 349/44 |
| 2007/0111412 | A1 * | 5/2007 | Oh et al. | 438/158 |
| 2007/0139597 | A1 * | 6/2007 | Shim et al. | 349/139 |
| 2007/0215876 | A1 * | 9/2007 | Lee et al. | 257/59 |
| 2007/0242176 | A1 * | 10/2007 | Chang et al. | 349/42 |
| 2008/0044982 | A1 * | 2/2008 | You | 438/443 |
| 2008/0048260 | A1 * | 2/2008 | Park et al. | 257/347 |

(Continued)

FOREIGN PATENT DOCUMENTS

| | | |
|---|---|---|
| JP | 06-208132 | 7/1994 |
| JP | 2003-029297 | 1/2003 |

(Continued)

*Primary Examiner* — Laura Menz
*Assistant Examiner* — Maliheh Malek
(74) *Attorney, Agent, or Firm* — F. Chau & Associates, LLC

(57) ABSTRACT

A thin film transistor array panel according to an exemplary embodiment of the present invention includes: an insulation substrate; a thin film transistor disposed on the insulation substrate, wherein the thin film transistor includes a first electrode; a first contact hole pattern having a first width, wherein the first contact hole pattern exposes a portion of the first electrode, and a first contact hole to expose the portion of the first electrode, wherein an inner sidewall of the first contact hole pattern constitutes a first portion of the first contact hole.

18 Claims, 26 Drawing Sheets

(56) References Cited

U.S. PATENT DOCUMENTS

| | | | |
|---|---|---|---|
| 2008/0067603 A1* | 3/2008 | Choung et al. | 257/365 |
| 2008/0213472 A1* | 9/2008 | Song | 427/162 |
| 2009/0102994 A1* | 4/2009 | Oh et al. | 349/38 |
| 2009/0170230 A1* | 7/2009 | Kidu et al. | 438/35 |
| 2009/0256985 A1* | 10/2009 | Jung et al. | 349/48 |
| 2009/0268112 A1* | 10/2009 | Lu et al. | 349/38 |
| 2010/0002161 A1* | 1/2010 | Shin et al. | 349/38 |
| 2010/0044717 A1* | 2/2010 | Choi et al. | 257/72 |
| 2010/0045920 A1* | 2/2010 | Kwak et al. | 349/153 |
| 2010/0134744 A1* | 6/2010 | Lee et al. | 349/143 |
| 2010/0136775 A1* | 6/2010 | Choi et al. | 438/585 |
| 2010/0149449 A1* | 6/2010 | Lee | 349/46 |
| 2011/0157526 A1 | 6/2011 | Shibata et al. | |
| 2012/0052625 A1* | 3/2012 | Yamazaki | 438/104 |
| 2012/0061665 A1* | 3/2012 | Miyake et al. | 257/43 |
| 2012/0064650 A1* | 3/2012 | Yamazaki et al. | 438/30 |
| 2012/0199838 A1* | 8/2012 | Park et al. | 257/60 |
| 2012/0244471 A1* | 9/2012 | Kim et al. | 430/281.1 |
| 2012/0320294 A1* | 12/2012 | Kim et al. | 349/41 |
| 2013/0020591 A1* | 1/2013 | Park et al. | 257/88 |
| 2013/0027627 A1* | 1/2013 | Kang et al. | 349/46 |
| 2013/0112979 A1* | 5/2013 | Nam et al. | 257/59 |
| 2013/0113734 A1* | 5/2013 | Cho et al. | 345/173 |
| 2013/0114014 A1* | 5/2013 | Kwak | 349/43 |
| 2013/0140559 A1* | 6/2013 | Yamazaki et al. | 257/43 |
| 2013/0140570 A1* | 6/2013 | Kang et al. | 257/59 |
| 2013/0214299 A1* | 8/2013 | Ryu et al. | 257/88 |
| 2013/0228777 A1* | 9/2013 | Yamazaki et al. | 257/43 |
| 2013/0249820 A1* | 9/2013 | Woo et al. | 345/173 |
| 2013/0258256 A1* | 10/2013 | Kim et al. | 349/102 |
| 2013/0306947 A1* | 11/2013 | Yamazaki et al. | 257/40 |
| 2013/0321483 A1* | 12/2013 | You et al. | 345/690 |
| 2013/0321499 A1* | 12/2013 | Park et al. | 345/698 |
| 2014/0132487 A1* | 5/2014 | Park et al. | 345/55 |
| 2014/0152948 A1* | 6/2014 | Chae et al. | 349/110 |

FOREIGN PATENT DOCUMENTS

| | | |
|---|---|---|
| JP | 2003-084309 | 3/2003 |
| JP | 2004-294805 | 10/2004 |
| JP | 2011-222688 | 11/2011 |
| KR | 1020090076046 | 7/2009 |
| KR | 100961952 | 5/2010 |

* cited by examiner

THIN FILM TRANSISTOR PANEL AND METHOD FOR MANUFACTURING THE SAME

CROSS-REFERENCE TO RELATED APPLICATION

This application claims priority under 35 U.S.C. §119 to Korean Patent Application No. 10-2013-0000770, filed on Jan. 3, 2013, in the Korean Intellectual Property Office, the disclosure of which is incorporated by reference herein in its entirety.

TECHNICAL FIELD

The present invention relates to a thin film transistor and a manufacturing method thereof.

DESCRIPTION OF THE RELATED ART

Liquid crystal displays are now widely used as one of flat panel displays. A liquid crystal display has two display panels on which field generating electrodes such as pixel electrodes and common electrodes are formed, and a liquid crystal layer interposed between the panels in the liquid crystal display, voltages are applied to the field generating electrodes so as to generate an electric field over the liquid crystal layer, and the alignment of liquid crystal molecules of the liquid crystal layer is determined by the electric field. Accordingly, the polarization of incident light is controlled, thereby performing image display.

Among these liquid crystal displays, two field generating electrodes that generate the electric field in the liquid crystal layer are formed on a thin film transistor array panel.

When the two field generating electrodes are formed on the thin film transistor array panel, a plurality of insulating layers are disposed between the thin film transistor and the field generating electrodes, and at least one of the plurality of insulating layers may be an organic insulator. At this time, when forming a contact hole to electrically connect the thin film transistor and the field generating electrode in the insulating layer, the organic insulator is reflowed such that the contact hole becomes small or may be filled.

The above information disclosed in this Background section is only for enhancement of understanding of the background of the invention and therefore it may contain information that does not form the prior art that is already known in this country to a person of ordinary skill in the art.

SUMMARY

The present invention forms two field generating electrodes in a thin film transistor array panel, wherein a width of a contact hole is minutely formed when using an organic insulator.

A thin film transistor array panel according to an exemplary embodiment of the present invention includes: an insulation substrate; a thin film transistor disposed on the insulation substrate, wherein the thin film transistor includes a first electrode; a first contact hole pattern having a first width, wherein the first contact hole pattern exposes a portion of the first electrode, and a first contact hole to expose the portion of the first electrode, wherein an inner sidewall of the first contact hole pattern constitutes a first portion of the first contact hole.

The thin film transistor array panel according to an exemplary embodiment of the present invention may further include: a first passivation layer disposed on the thin film transistor; a second passivation layer disposed on the first passivation layer; a first field generating electrode disposed on the second passivation layer; a third passivation layer disposed on the first field generating electrode; a second field generating electrode disposed on the third passivation layer and connected to the first electrode of the thin film transistor though the first contact hole.

The first passivation layer may includes an inorganic insulating material, and the first contact hole pattern may include a substantially same material as the first passivation layer.

The second passivation layer may include an organic insulating material.

A sidewall of the second passivation layer may constitute a second portion of the first contact hole and a sidewall of the third passivation layer may constitute a third portion of the first contact hole.

A width of the first contact hole pattern may be less than 8 μm.

The thin film transistor array panel according to an exemplary embodiment of the present invention may further include: a reference voltage line connected to the first field generating electrode; and a gate insulating layer disposed on the reference voltage line, wherein the first field generating electrode may be connected to the reference voltage line through a second contact hole exposing a portion of the reference voltage line.

The thin film transistor array panel according to an exemplary embodiment of the present invention may further include a second contact hole pattern exposing a portion of the reference voltage line and separated from the first passivation layer.

The thin film transistor array panel according to an exemplary embodiment of the present invention may further include a second contact hole to expose the portion of the reference voltage line, wherein a sidewall of the gate insulating layer may constitute a first portion of the second contact hole, an inner sidewall of the second contact hole may constitute a second portion of the second contact hole, and a sidewall of the second passivation layer may constitute a third portion of the second contact hole.

A width of the second contact hole pattern may be less than 8 μm.

The second field generating electrode may have a plurality of branch electrodes.

The first contact hoe pattern may include a circular shape.

The first passivation layer may include a sidewall spaced apart from an outer sidewall of the first contact hole pattern.

A space between the sidewall of the first passivation layer and the outer sidewall of the first contact hole pattern may expose a portion of the first electrode.

A manufacturing method of a thin film transistor array panel according to an exemplary embodiment of the present invention includes: forming a thin film transistor on an insulation substrate; forming a first passivation layer on the thin film transistor; forming a first contact hole pattern having a first width in the first passivation layer; forming a second passivation layer having a preliminary contact hole having a second width, wherein the preliminary contact hole has a second width greater than the first width and overlaps the first contact hole pattern, and reflowing the second passivation layer to form a first contact hole, wherein an inner sidewall of the first contact hole pattern constitutes a portion of a sidewall of the first contact hole.

The manufacturing method of a thin film transistor array panel according to an exemplary embodiment of the present invention may further include forming a first field generating electrode on the second passivation layer; forming a third passivation layer including a third portion of the first contact hole extended from the second portion of the first contact hole on the first field generating electrode; and forming a second field generating electrode connected to the thin film transistor through the first contact hole on the third passivation layer, wherein the first portion of the first contact hole may be separated from the first passivation layer and be a first contact hole pattern for exposing a portion of the thin film transistor.

The second field generating electrode may include a plurality of branch electrodes.

According to an exemplary embodiment of the present invention, the first passivation layer made of the inorganic insulating material exposes the drain electrode, and the first contact hole pattern separated from the first passivation layer is formed such that the organic insulating material may be prevented from being reflowed into the contact hole when forming the second passivation layer made of the organic insulating material.

Accordingly, the width of the contact hole may be minutely controlled and maintained.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
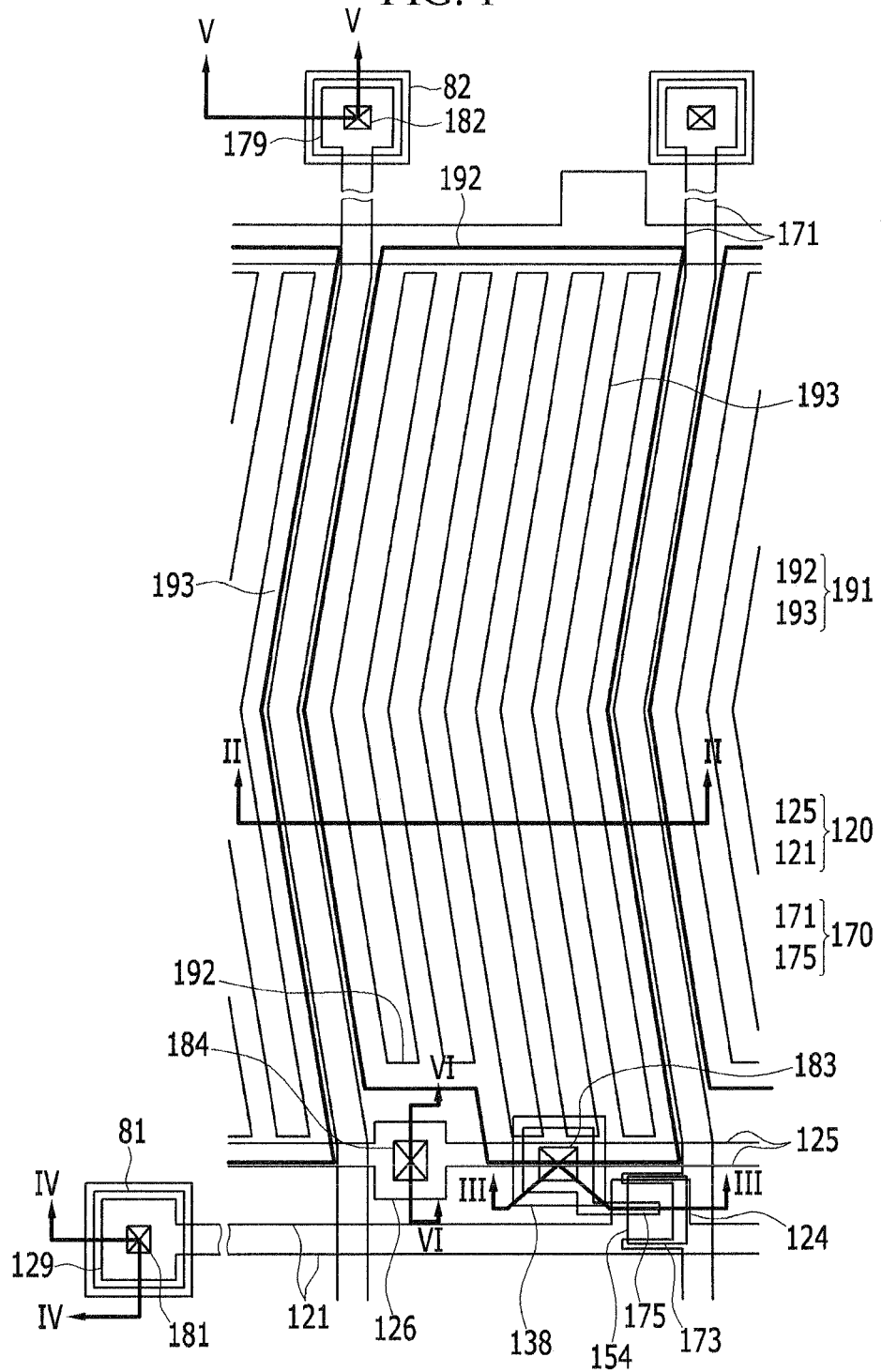
FIG. 1 is a layout view of a thin film transistor array panel according to an exemplary embodiment of the present invention.

Exemplary embodiments of the present invention will be described in detail with reference to the accompanying drawings. However, the present invention is not limited to exemplary embodiments described herein, and may be embodied in different forms and should not be construed as limited to the embodiments set forth herein. Rather, these exemplary embodiments described herein are provided so that this disclosure will be thorough and complete and will fully convey the present invention to a person of ordinary skill in the art.

In the drawings, the thicknesses of layers and regions are exaggerated for clarity. It is to be noted that when a layer is referred to as being "on" another layer or substrate, it can be directly formed on the other layer or substrate or can be formed on the other layer or substrate with a third layer interposed therebetween. Like constituent elements are denoted by like reference numerals throughout the specification.

Now, a thin film transistor array panel according to an exemplary embodiment of the present invention will be described with reference to FIG. 1 to FIG. 6.

Figure 2:
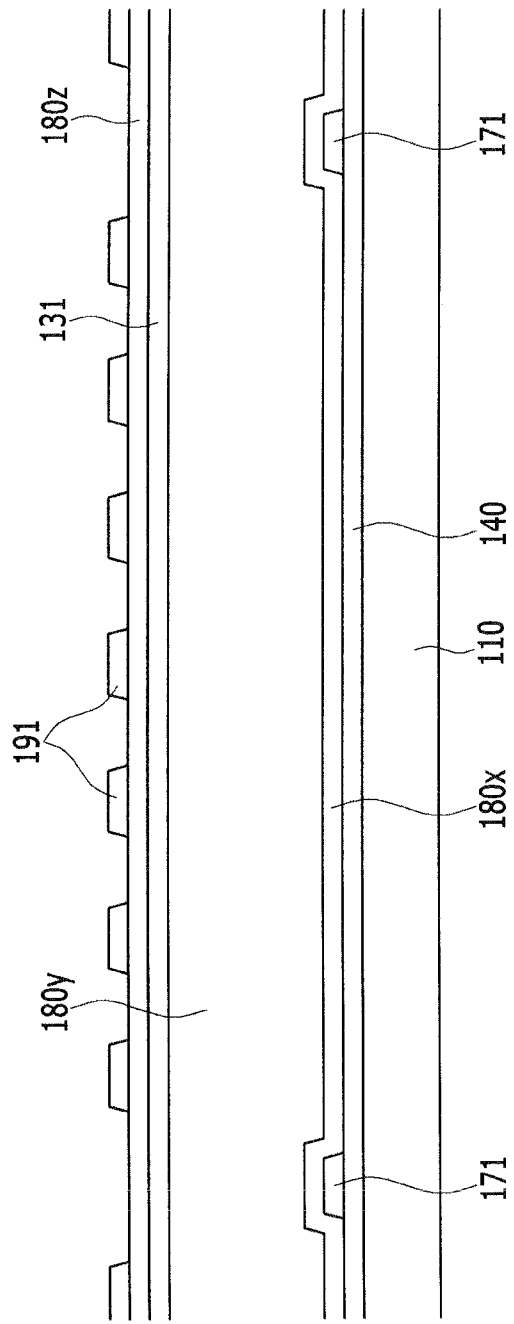
FIG. 2 is a cross-sectional view of a thin film transistor array panel taken along line II-II of FIG. 1.
Figure 3:
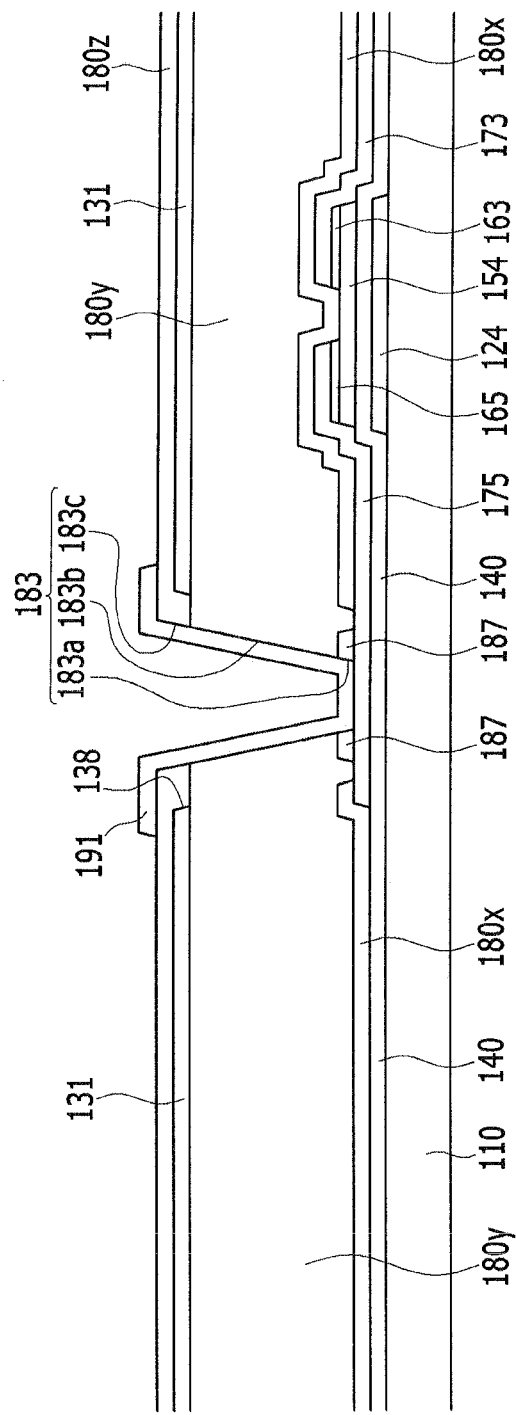
FIG. 3 is a cross-sectional view of a thin film transistor array panel taken along line of FIG. 1.
Figure 4:
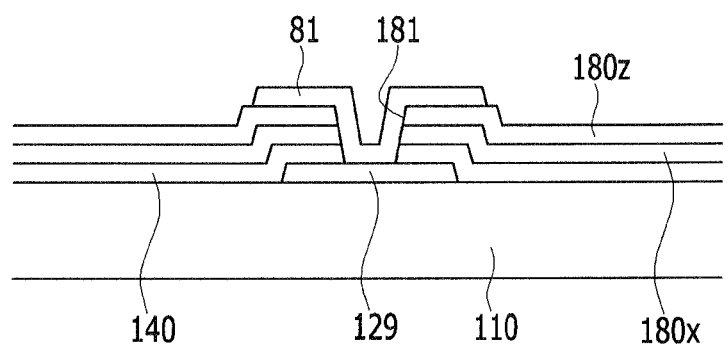
FIG. 4 is a cross-sectional view of a thin film transistor array panel taken along line IV-IV of FIG. 1.
Figure 5:
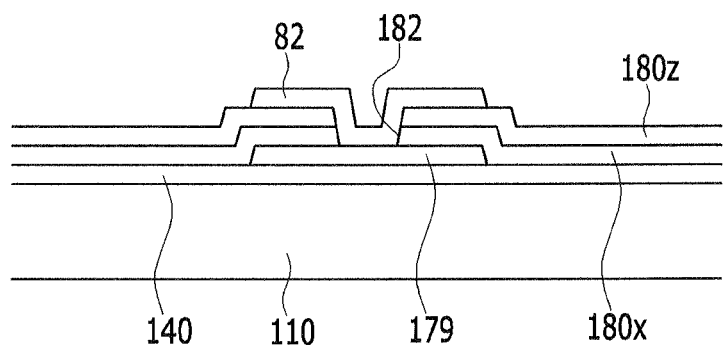
FIG. 5 is a cross-sectional view of a thin film transistor array panel taken along line V-V of FIG. 1.
Figure 6:
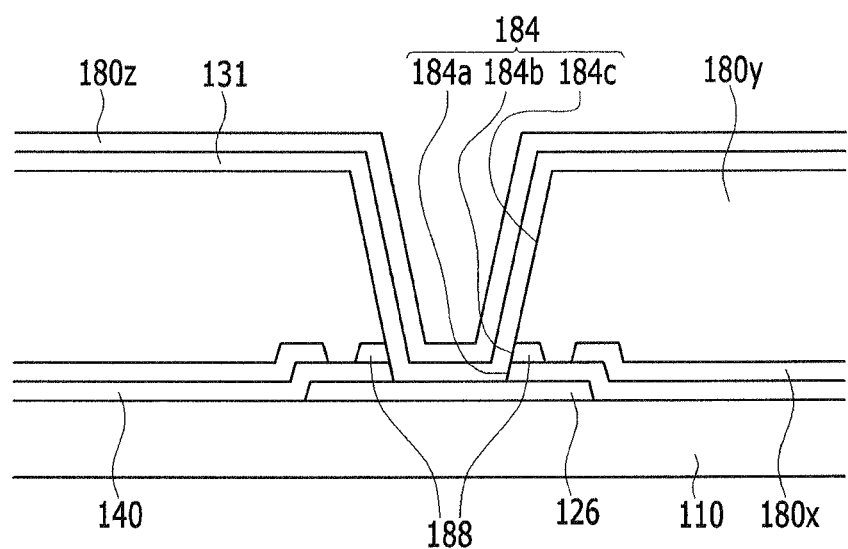
FIG. 6 is a cross-sectional view of a thin film transistor array panel taken along line VI-VI of FIG. 1.
Figure 7:
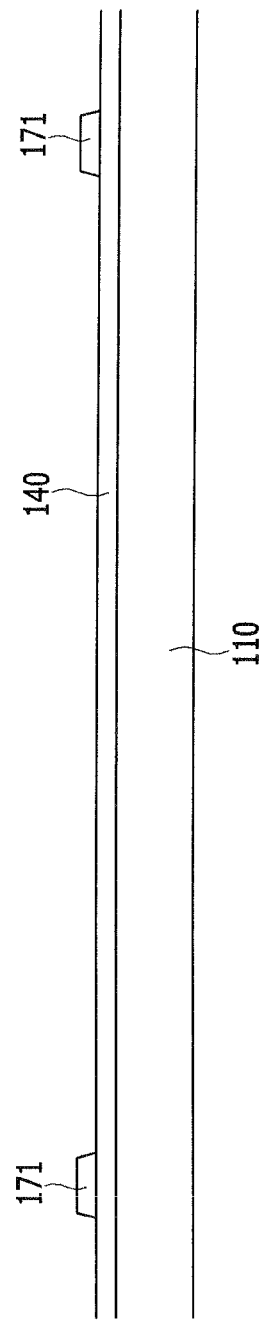
FIG. 7 to FIG. 26 are cross-sectional views of a manufacturing method of a thin film transistor array panel according to an exemplary embodiment of the present invention.
Figure 8:
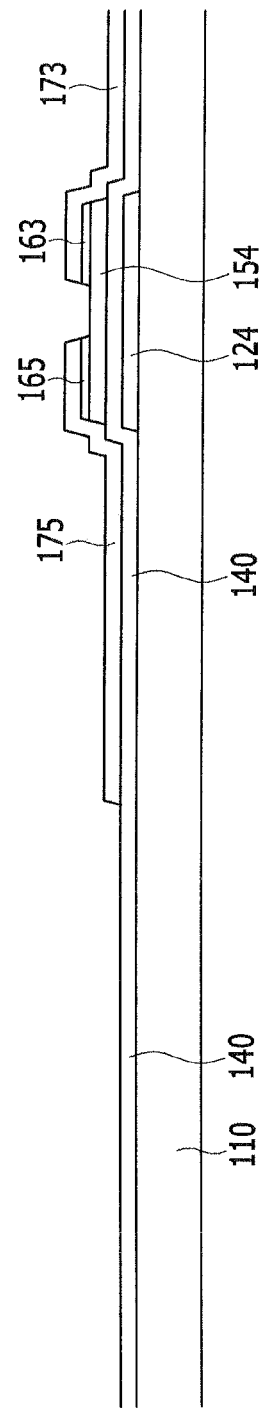
Figure 9:
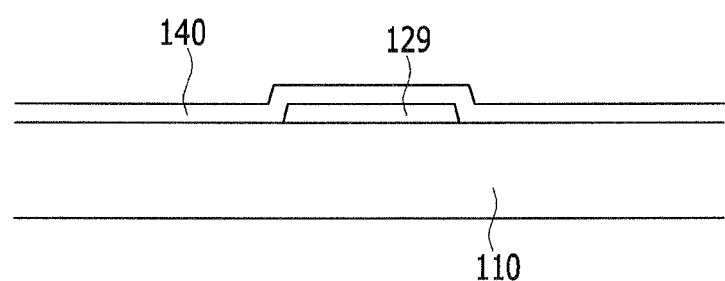
Figure 10:
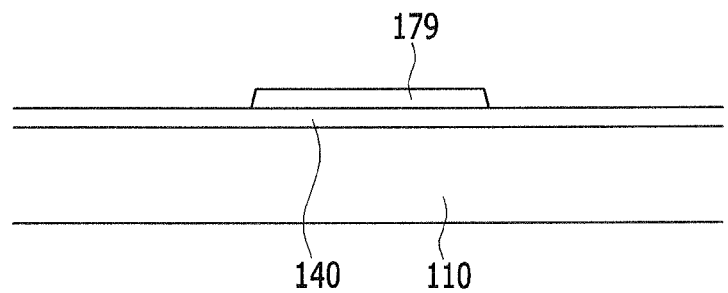
Figure 11:
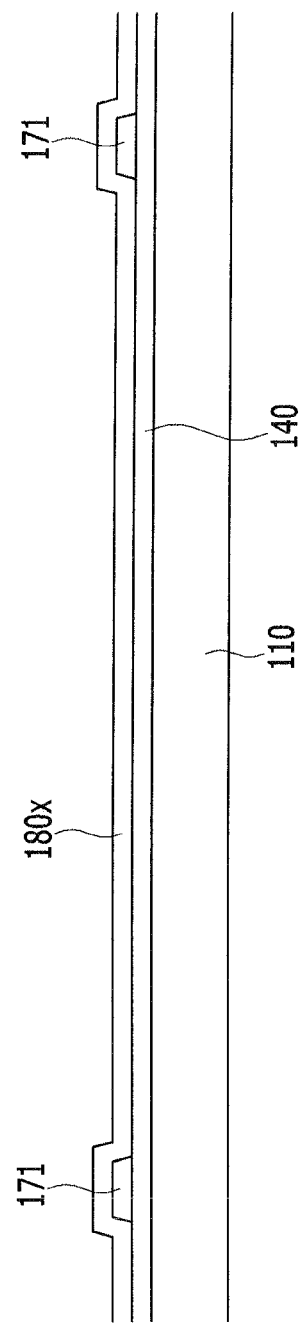
Figure 12:
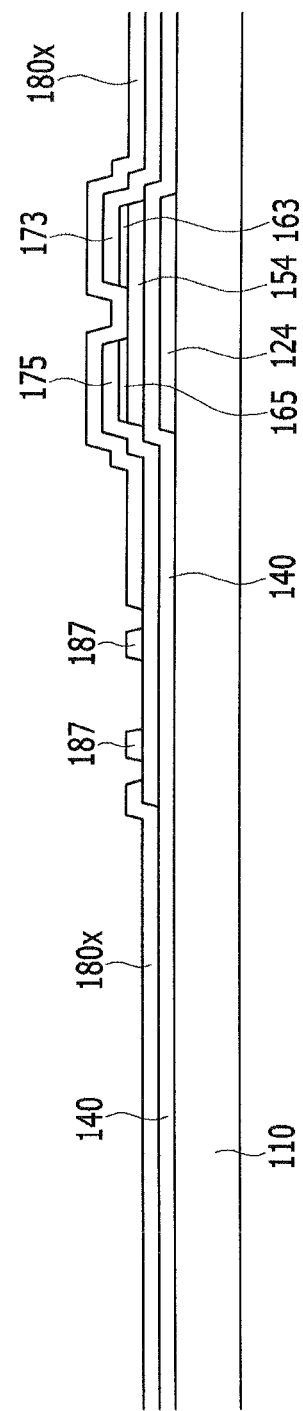
Figure 13:
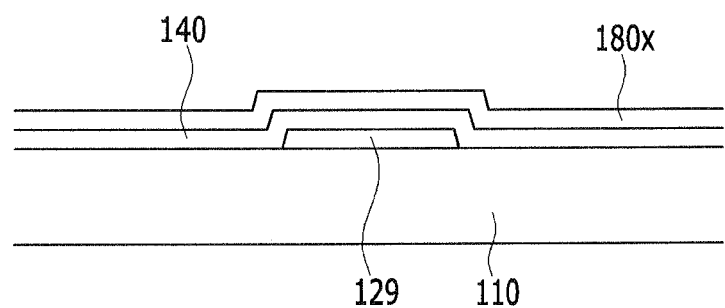
Figure 14:
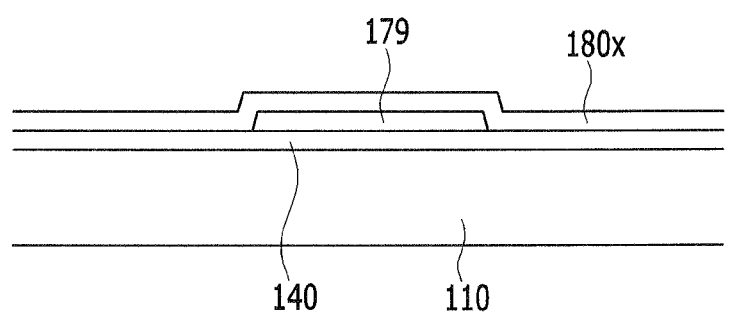
Figure 15:
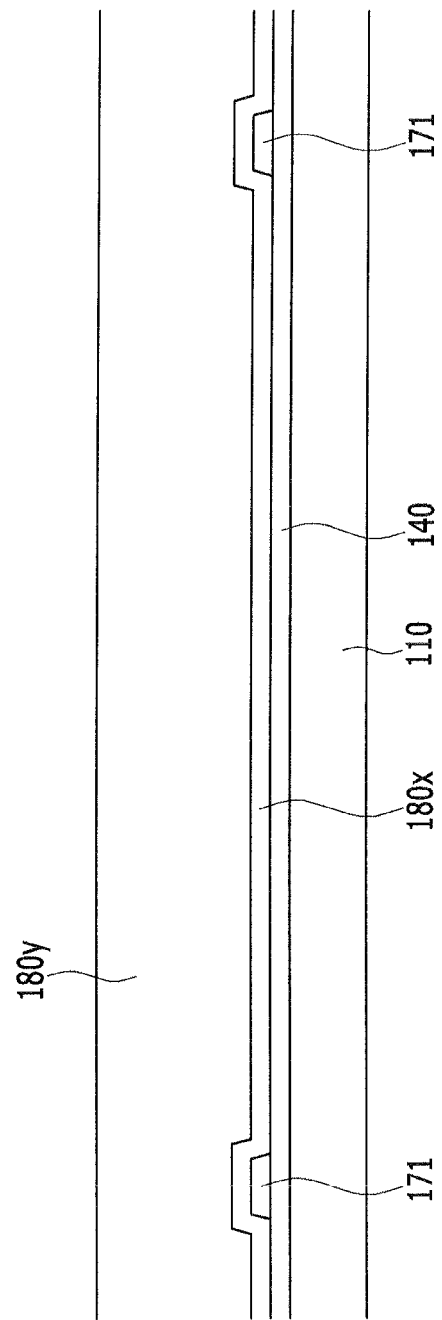
Figure 16:
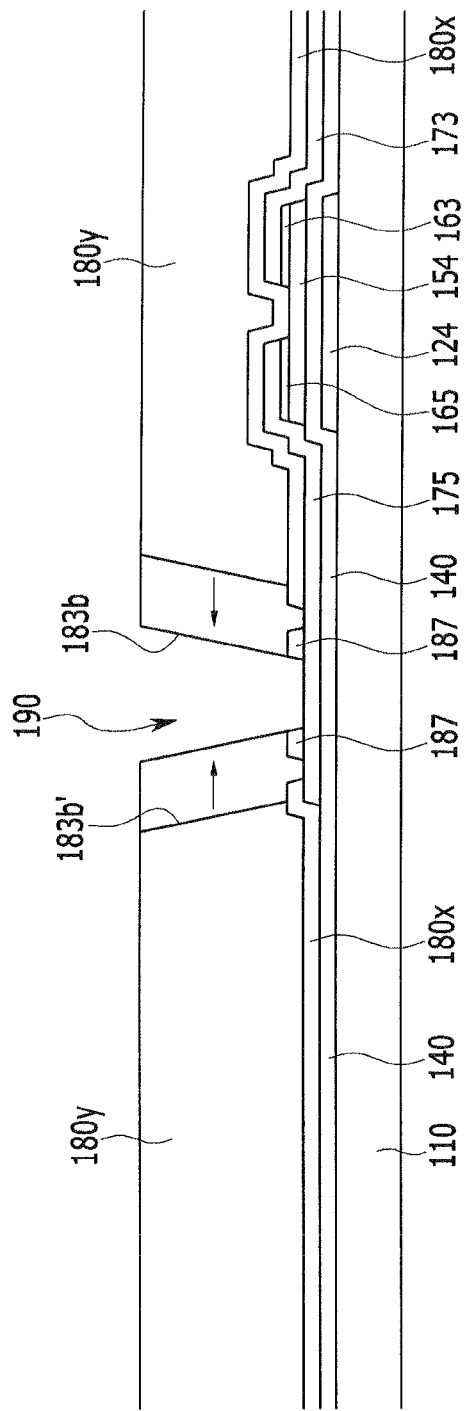
Figure 17:
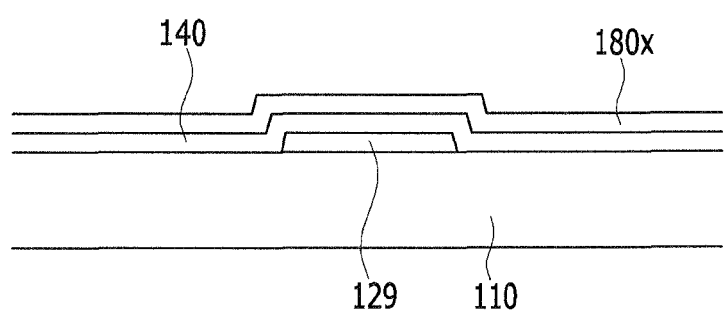
Figure 18:
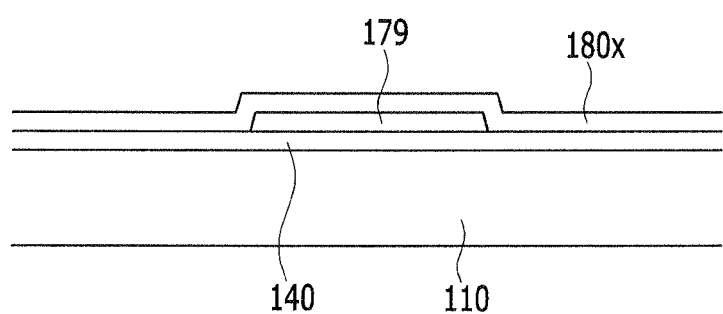
Figure 19:
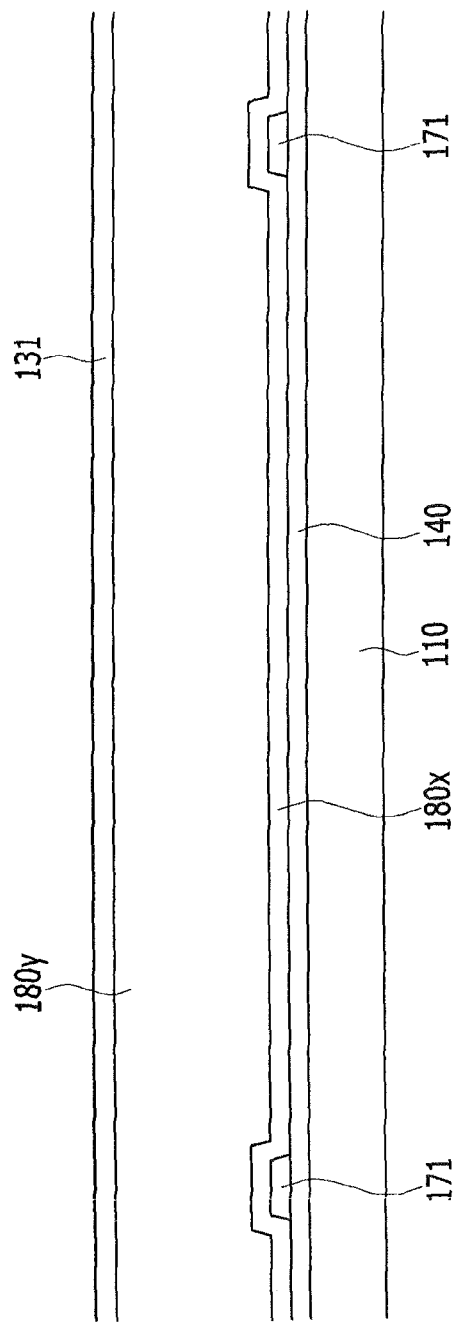
Figure 20:
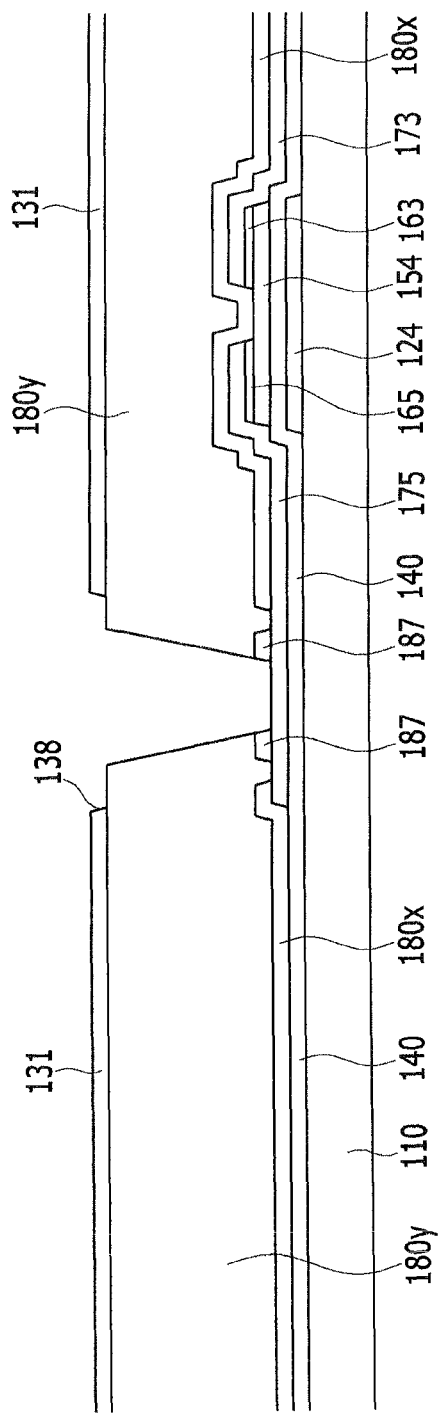
Figure 21:
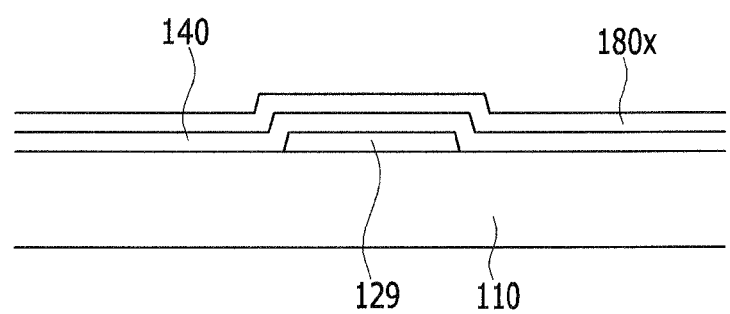
Figure 22:
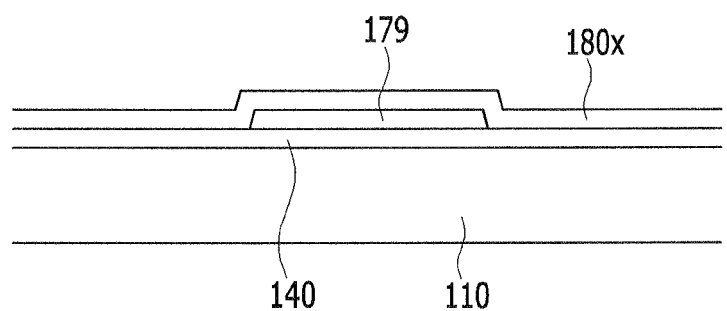
Figure 23:
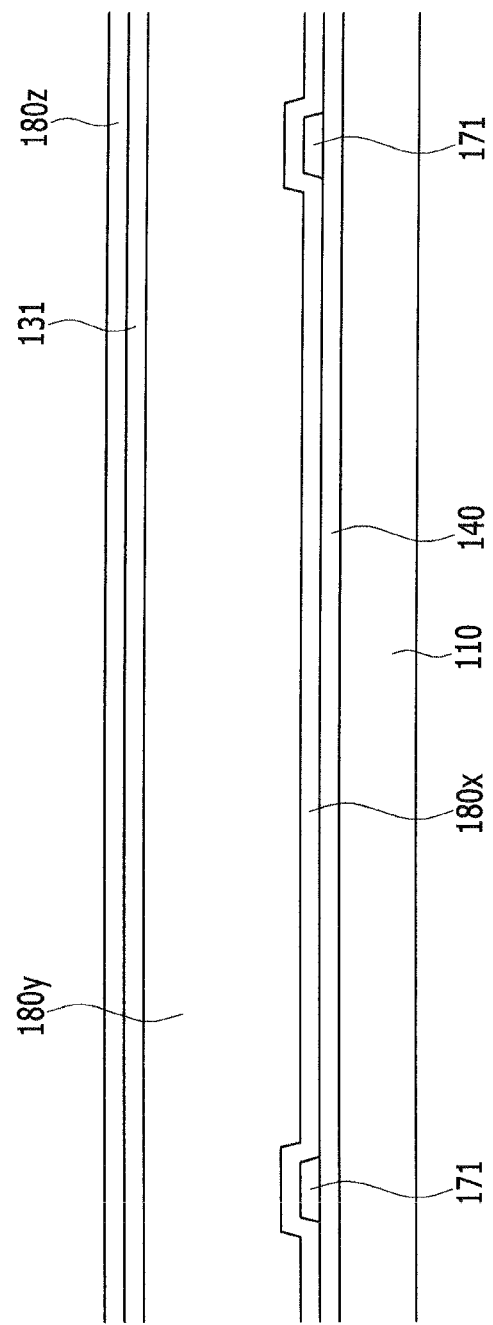
Figure 24:
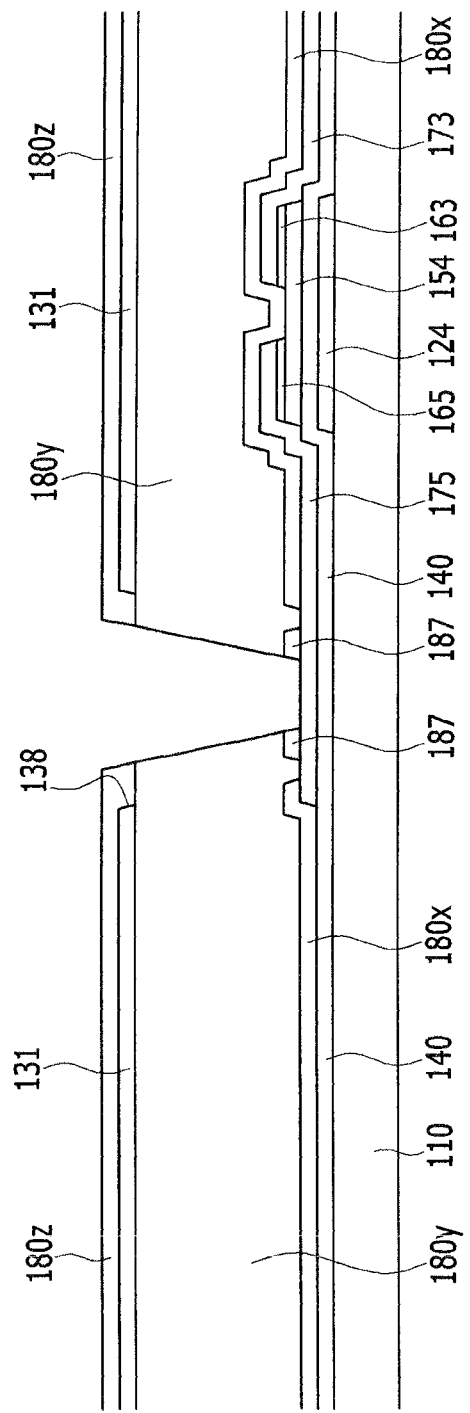
Figure 25:
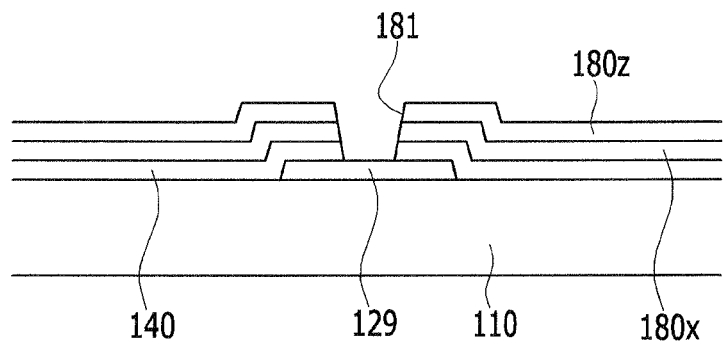
Figure 26:
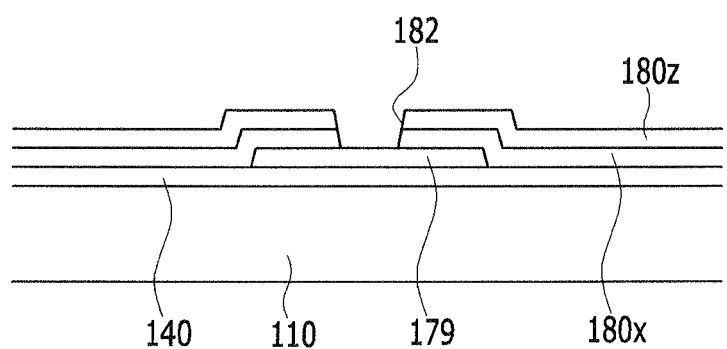

FIG. 1 is a layout view of a thin film transistor array panel according to an exemplary embodiment of the present invention, FIG. 2 is a cross-sectional view of a thin film transistor array panel taken along line II-II of FIG. 1, FIG. 3 is a cross-sectional view of a thin film transistor array panel taken along line of FIG. 1, FIG. 4 is a cross-sectional view of a thin film transistor array panel taken along line IV-IV of FIG. 1, FIG. 5 is a cross-sectional view of a thin film transistor array panel taken along line V-V of FIG. 1, and FIG. 6 is a cross-sectional view of a thin film transistor array panel taken along line VI-VI of FIG. 1.

Referring to FIG. 1 to FIG. 6, a gate conductor 120, formed on an insulation substrate, includes a gate line 121 and a reference voltage line 125.

The gate line 121 includes a gate electrode 124 and a gate pad 129. The gate pad 129 is disposed at an end of the gate electrode 124. The gate pad 129 has a large area to provide an area for contacting with another layer or an external driving circuit. A gate driving circuit (not shown) generates a gate signal and outputs the gate signal to the gate line 121. The gate driving circuit (not shown) may be mounted on a flexible printed circuit film (not shown) that is attached on the insulation substrate 110. Alternatively, the gate driving circuit (not shown) may be directly mounted on the insulation substrate 110.

The reference voltage line 125 extends mainly in a horizontal direction, and may be substantially parallel to the gate line 121. The reference voltage line 125 serves to transmit a predetermined voltage such as a reference voltage. The reference voltage line 125 includes a voltage line pad 126.

The gate line 121 and the reference voltage line 125 may include a singular layer. Alternatively, the gate line 121 and the reference voltage line 125 may include a multiple layers including at least two conductive layers.

A gate insulating layer 140 is disposed on the gate conductor 120. The gate insulating layer 140 may include an inorganic insulating material such as silicon nitride (SiNx) and/or silicon oxide (SiOx).

A semiconductor layer 154 is overlapped with the gate electrode 124. The gate insulating layer 140 is disposed therebetween. Ohmic contact layers 163 and 165 are disposed on the semiconductor layer 154.

A data conductor 170 includes a data line 171 and a drain electrode 175. The drain electrode 175, formed on the gate insulating layer 140, includes a portion disposed on the ohmic contact layer 165.

The data line 171 extends in a longitudinal direction to cross the gate line 121 and the reference voltage line 125. The data line 171 includes a source electrode 173 extending toward the gate electrode 124 and a data pad 179 having a wide area for connection with another layer or an external driving circuit. The drain electrode 175 faces the source electrode 173 with respect to the gate electrode 124, and has a bar end and a wide end. A data driving circuit (not shown) generating a data signal may be mounted on a flexible printed circuit film (not shown) attached to the substrate 110 or may be directly mounted on the substrate 110.

The data line 171 is bent and forms an oblique angle with an extending direction of the gate line 121. The oblique angle between the data line 171 and the extending direction of the gate line 121 may be more than 45 degrees. Alternatively, the data line 171 may be extended in a straight line.

The data line 171 and the drain electrode 175 may include a singular layer or a multiple layer including at least two conductive layers.

One gate electrode 124, one source electrode 173, and one drain electrode 175 form one thin film transistor (TFT) along with the semiconductor layer 154, and a channel (not shown) of the thin film transistor is formed in the semiconductor layer 154 between the source electrode 173 and the drain electrode 175.

A first passivation layer 180x is disposed on the data conductor 170 and the channel (not shown) of the thin film transistor. The first passivation layer 180x may include the inorganic insulating material such as silicon nitride (SiNx) and/or silicon oxide (SiOx).

The first passivation layer 180x has a first contact hole pattern 187 and a second contact hole pattern 188. The first contact hole pattern exposes a portion of the drain electrode 175 and a second contact hole pattern 188 exposes a portion of the voltage line pad 126 of the reference voltage line 125. The first contact hole pattern 187 and the second contact hole pattern 188 are separated from the first passivation layer 180x. The first and second contact hole patterns 187 and 188 may have a plane shape including a polygon such as a quadrangle, a circular shape, and/or an oval shape. For example, when a first contact hole 183 has a circular bottom, the first contact hole pattern 187 may have a circular shape. A inner diameter of the first contact hole pattern 187 and the second contact hole pattern 188 may be less than about 8 μm.

A second passivation layer 180y is disposed on the first passivation layer 180x. The second passivation layer 180y may include an organic insulating material, and an upper surface of the second passivation layer 180y is flat. In regions corresponding to the gate pad 129 and the data pad 179, the second passivation layer 180y is removed.

Although not shown, in the thin film transistor array panel according to an exemplary embodiment of the present invention, the second passivation layer 180y may include a color filter (not shown) and a capping layer (not shown) disposed on the color filter. The capping layer (not shown) may serve to prevent a pigment of the color filter from flowing into a liquid crystal layer (not shown). The capping layer may include an insulating material such as silicon nitride (SiNx).

A first field generating electrode 131 is disposed on the second passivation layer 180y. The first field generating electrode 131 may include a transparent conductive material such as indium tin oxide (ITO) and/or indium zinc oxide (IZO). In an exemplary embodiment, the first field generating electrode 131 may have a plate shape. The first field generating electrode 131 has an opening 138 overlapped with one end of the drain electrode 175. The other end of the drain electrode 175 is overlapped with the semiconductor layer 154.

A third passivation layer 180z is disposed on the first field generating electrode 131, and a second field generating electrode 191 is disposed thereon. The second field generating electrode 191 may include the transparent conductive material such as ITO and/or IZO.

The second field generating electrode 191 includes a plurality of branch electrodes 193 substantially parallel to each other and separated from each other, and lower and upper transverse portions 192 connecting lower and upper ends of the branch electrodes 193. The branch electrodes 193 of the second field generating electrode 191 may be bent in parallel to the data line 171. Alternatively, the data line 171 and the branch electrodes 193 of the second field generating electrode 191 may be extended in a straight line.

The first passivation layer 180x, the second passivation layer 180y, and the third passivation layer 180z have a first contact hole 183 exposing a portion of the drain electrode 175. The first contact hole 183 has a first portion 183a, a second portion 183b, and a third portion 183c. For example, an inner sidewall of the first contact hole pattern 187 constitutes the first portion 183a. A sidewall of the second passivation layer 180y constitutes the second portion 183b. A sidewall of the third passivation layer 180z constitutes the third portion 183c of the first contact hole 183.

The second field generating electrode 191 is electrically connected to the drain electrode 175 through the first contact hole 183.

The first passivation layer 180x, the second passivation layer 180y, and the gate insulating layer 140 have a second contact hole 184 exposing the voltage line pad 126 of the reference voltage line 125. The second contact hole 184 has a first portion 184a, a second portion 184b, and a third portion 184c. For example, a sidewall of the first passivation layer 180x constitutes the first portion 184a. An inner sidewall of the second contact hole pattern 188 constitutes the first portion 184b. A sidewall of the second passivation layer 180y constitutes the third portion 184c.

The first field generating electrode 131 is electrically connected to the voltage line pad 126 of the reference voltage line 125 through the second contact hole 184.

The first contact hole pattern 187 and the second contact hole pattern 188 serve to stop the second passivation layer 180y from being further reflowed in a reflow process of the second passivation layer 180y. For example, the second portion 183b may be self-aligned with the inner sidewall of the first contact hole pattern 187 in a reflow process. Similarly, the third portion 184c is self-aligned with the inner sidewall of the second contact hole pattern 188. Accordingly, the first contact hole 183 and the second contact hole 184 include openings of which bottom widths are determined by the first contact hole pattern 187 and the second contact hole pattern 188, respectively. For example, when the width of the first contact hole pattern 187 and the second contact hole pattern 188 is less than about 8 μm, the width of the first contact hole 183 and the width of the width of second contact hole 184 may be respectively less than about 8 μm.

The first passivation layer 180x, the third passivation layer 180z, and the gate insulating layer 140 have a third contact hole 181 exposing the gate pad 129. In an exemplary embodiment, more than one third contact holes 181 may exist, and the plane shape may be the polygon such as the quadrangle, circular, or oval.

A first connecting member 81 is disposed in the third contact hole 181. The first connecting member 81 may be simultaneously formed when the second field generating electrode 191 is formed. For example, the first connecting member 81 may include a substantially same material as that of the second field generating electrode 191.

The first passivation layer 180x and the third passivation layer 180z have a fourth contact hole 182 exposing the data pad 179. In an exemplary embodiment, more than one fourth contact holes 182 may exist, and the plane shape may be the polygon such as the quadrangle, circular or oval.

A second connecting member 82 is disposed in the fourth contact hole 182. The second connecting member 82 may be simultaneously formed when the second field generating electrode 191 is formed. For example, the second connection member 82 may include a substantially same material as that of the second field generating electrode 191.

The first field generating electrode 131 is connected to the voltage line pad 126 of the reference voltage line 125 through the second contact hole 184 to receive the reference voltage.

The second field generating electrode 191 is connected to the drain electrode 175 through the first contact hole 183 to receive the data voltage.

The first field generating electrode 131 and the second field generating electrode 191 respectively applied with the reference voltage and data voltage may generate an electric field to a liquid crystal layer (not shown).

In the case of the thin film transistor array panel according to an exemplary embodiment, the first field generating electrode 131 of the plate shape is disposed under the third passivation layer 180z and the second field generating electrode 191 having the branch electrodes 193 is disposed on the third passivation layer 180z. Alternatively, the second field generating electrode 191 having the branch electrodes 193 may be disposed under the third passivation layer 180z and the first field generating electrode 131 of the plate shape may be disposed on the third passivation layer 180z.

In an exemplary embodiment, one of the first field generating electrode 131 and the second field generating electrode 191 may include the branch electrode, and the other may have the plate shape.

In an exemplary embodiment, one of the first field generating electrode 131 and the second field generating electrode 191 receives the reference voltage and the other receives the data voltage.

For example, all characteristics of the thin film transistor array panel according to an exemplary embodiment of the present invention may be applied to a case where two field generating electrodes of the common electrode and the pixel electrode are disposed on a thin film transistor array panel.

As described above, when the second passivation layer 180y including an organic insulating material is reflowed in the first and second contact holes 183 and 184 during a reflow process, the first and second contact hole patterns 187 and 188 including an inorganic insulating material may stop the second passivation layer 180y from being further reflowed to secure minimum widths of the first and second contact holes 183 and 184.

Next, a manufacturing method of a thin film transistor array panel according to an exemplary embodiment of the present invention will be described with reference to FIG. 7 to FIG. 26 as well as FIG. 2 to FIG. 5.

FIG. 7 to FIG. 26 are cross-sectional views of a manufacturing method of a thin film transistor array panel according to an exemplary embodiment of the present invention. FIGS. 7, 11, 15, 19, and 23 are cross-sectional views taken along line II-II of FIG. 1. FIGS. 8, 12, 16, 20, and 24 are cross-sectional views taken along line of FIG. 1. FIGS. 9, 13, 17, 21, and 25 are cross-sectional views taken along line IV-IV of FIG. 1. FIGS. 10, 14, 18, 22, and 26 are cross-sectional views taken along line V-V of FIG. 1.

As shown in FIG. 7 to FIG. 10, a gate electrode 124 and a gate pad 129 are formed on an insulation substrate 110. At this time, although not shown, a gate line 121 and a reference voltage line 125 including an expansion 126 are formed together. For example, gate conductors 121 and 125 are formed on the insulation substrate 110.

Next, a gate insulating layer 140 is deposited on the gate conductors 121 and 125, and a semiconductor layer 154 and ohmic contact layers 163 and 165 are sequentially deposited thereon. Next, data conductors 171 and 175 including a data line 171 having a source electrode 173 and a data pad 179, and a drain electrode 175, are formed on the gate insulating layer 140 and the ohmic contact layer 163 and 165.

Referring to FIG. 11 to FIG. 14, the first passivation layer 180x including the first contact hole pattern 187 is formed on the data conductors 171 and 175. The first contact hole pattern 187 is formed to expose a portion of the drain electrode 175 and to be separated from the first passivation layer 180x. The first passivation layer 180x may include an inorganic insulating material such as silicon nitride (SiNx) and/or silicon oxide (SiOx). The width of the first contact hole pattern 187 may be about 8 μm. As shown in FIG. 3, the first contact hole pattern 187, exposing the portion of the drain electrode 175, includes a sidewall which is the first portion 183a of the first contact hole 183.

Here, although not shown, the second contact hole pattern 188 of FIG. 6 is simultaneously formed when the first contact hole pattern 187 is formed. The second contact hole pattern 188 is formed on the first passivation layer 180x and exposes the portion of the expansion 126 of the reference voltage line 125.

As shown in FIG. 15 to FIG. 18, the second passivation layer 180y is formed on the first passivation layer 180x. The second passivation layer 180y may include an organic insulating material. At this time, a sidewall 183b' of the first contact hole 183 is formed in the second passivation layer 180y by forming a first opening 190. The first opening 190 exposes the first contact hole pattern 187. The second passivation layer 180y is removed in the region corresponding to the gate pad 129 and the data pad 179.

In curing the second passivation layer 180y, the second passivation layer 180y is reflowed so that the sidewall 183b' may move inwards. The reflow is constrained by the first contact hole pattern 187. For example, the first hole pattern 187 serves to stop the second passivation layer 180y reflowing further and form the second portion 183b of the first contact hole 183. The second portion 183b is aligned with a sidewall of the first contact hole pattern 187. The sidewall of the first contact hole pattern 187 constitutes the first portion 183a of the first contact hole 183. Similarly, the second contact hole pattern 188 serves to stop the second passivation layer 180y reflowing further and form the 184b of the second contact hole 184.

Referring to FIG. 19 to FIG. 22, the first field generating electrode 131 is formed on the second passivation layer 180y. The first field generating electrode 131 includes a second opening 138 positioned at the region corresponding to the drain electrode 175 and is formed at a region corresponding to the gate pad 129 and the data pad 179.

Referring to FIG. 23 to FIG. 26, the third passivation layer 180z is formed on the first field generating electrode 131 and the portion of the first passivation layer 180x. The third passivation layer 180z includes a sidewall which constitutes the third portion 183c of the first contact hole 183. The third portion 183c of the first contact hole 183 is aligned with the second portion 183b of the first contact hole 183.

At this time, the third passivation layer 180z and the first passivation layer 180x covering the gate pad 129 and the data pad 179 are etched together to form the third contact hole 181 and the fourth contact hole 182.

As shown in FIG. 2 to FIG. 5, the first and second connecting members 81 and 82 and the second field generating electrode 191 are formed on the third passivation layer 180z.

As described above, the first and second contact hole patterns 187 and 188 serve to stop the second passivation layer 180y from further reflowing, thereby at least securing a minimum width of the first and second contact holes 183 and 184 in a reflow process.

The present invention may be applied to a method of forming a thin film transistor array panel. In the case of the thin film transistor array panel according to an exemplary embodiment, one of the two field generating electrodes that are overlapped with each other has a plate shape and the other has a branch shape. The present invention is not limited thereto, but the present invention may be applied to thin film transistor array panels of which two field generating electrodes are formed in various shapes.

While the present invention has been shown and described with reference to exemplary embodiments thereof, it will be apparent to those of ordinary skill in the art that various changes in form and detail may be made therein without departing from the sprit and scope of the present invention as defined by the following claims. It is therefore desired that the present exemplary embodiments be considered in all respects as illustrative and not restrictive, reference being made to the appended claims rather than the foregoing description to indicate the scope of the inventive concept.

What is claimed is:

1. A thin film transistor array panel comprising:
   an insulation substrate;
   a thin film transistor disposed on the insulation substrate, wherein the thin film transistor includes a first electrode;
   a first contact hole pattern having an opening of a first width, wherein the first contact hole pattern exposes a portion of the first electrode through the opening; and
   a first contact hole exposing the portion of the first electrode,
   a first passivation layer disposed on the thin film transistor;
   wherein an inner sidewall of the first contact hole pattern constitutes a first portion of the first contact hole,
   wherein the first passivation layer includes a sidewall spaced apart from an outer sidewall of the first contact hole pattern to form a space between the first contact hole pattern and the first passivation layer, and
   wherein the space between the sidewall of the first passivation layer and the outer sidewall of the first contact hole pattern exposes the portion of the first electrode.

2. The thin film transistor array panel of claim 1 further comprising:
   a second passivation layer disposed on the first passivation layer;
   a first field generating electrode disposed on the second passivation layer;
   a third passivation layer disposed on the first field generating electrode; and
   a second field generating electrode disposed on the third passivation layer and connected to the first electrode of the thin film transistor though the first contact hole.

3. The thin film transistor array panel of claim 2, wherein the first passivation layer includes an inorganic insulating material, and the first contact hole pattern includes a substantially same material as the first passivation layer.

4. The thin film transistor array panel of claim 3, wherein the second passivation layer includes an organic insulating material.

5. The thin film transistor array panel of claim 2, wherein a sidewall of the second passivation layer constitutes a second portion of the first contact hole and a sidewall of the third passivation layer constitutes a third portion of the first contact hole.

6. The thin film transistor array panel of claim 1, wherein a width of the first contact hole pattern is less than about 8 μm.

7. The thin film transistor array panel of claim 2, further comprising:
   a reference voltage line connected to the first field generating electrode; and
   a gate insulating layer disposed on the reference voltage line, wherein the first field generating electrode is connected to the reference voltage line through a second contact hole exposing a portion of the reference voltage line.

8. The thin film transistor array panel of claim 7, further comprising a second contact hole pattern exposing a portion of the reference voltage line and separated from the first passivation layer.

9. The thin film transistor array panel of claim 8, further comprising a second contact hole to expose the portion of the reference voltage line, wherein a sidewall of the gate insulating layer constitutes a first portion of the second contact hole, an inner sidewall of the second contact hole constitutes a second portion of the second contact hole, and a sidewall of the second passivation layer constitutes a third portion of the second contact hole.

10. The thin film transistor array panel of claim 8, wherein a width of the second contact hole pattern is less than about 8 μm.

11. The thin film transistor array panel of claim 1, wherein the second field generating electrode has a plurality of branch electrodes.

12. The thin film transistor array panel of claim 1, wherein the first contact hole pattern include a circular shape.

13. A method of manufacturing a thin film transistor array panel, comprising:
    forming a thin film transistor on an insulation substrate;
    forming a first passivation layer on the thin film transistor;
    forming a first contact hole pattern having an opening of a first width by patterning the first passivation layer, wherein the first passivation Layer is separated into the first contact hole pattern and a patterned first passivation layer;
    forming a second passivation layer having a preliminary contact hole having a second width, wherein the second width is greater than the first width and overlaps the first contact hole pattern, and
    reflowing the second passivation layer to form a first contact hole,
    wherein an inner sidewall of the first contact hole pattern constitutes a first portion of a sidewall of the first contact hole,
    wherein a sidewall of the second passivation layer constitutes a second portion of the sidewall of the first contact hole, the second portion is extended from the first portion of the first contact hole, and
    wherein the first contact hole pattern is spaced apart from the patterned first passivation layer to form a space through which a portion of the thin film transistor is exposed.

14. The method of claim 13, wherein a width of the opening in the first contact hole pattern is less than about 8 μm.

15. The method of claim 13, wherein the opening of the first contact hole pattern has a circular shape.

16. The method of claim 13, further comprising:
    forming a first field generating electrode on the second passivation layer;
    forming a third passivation layer including a third portion of the first contact hole extended from the second portion of the first contact hole on the first field generating electrode; and
    forming a second field generating electrode connected to the thin film transistor through the first contact hole on the third passivation layer.

17. The method of claim 13, wherein the first passivation layer includes an inorganic insulating material, and the first contact hole pattern includes a substantially same material as the first passivation layer.

18. The method of claim 13, wherein the second passivation layer includes an organic insulating material.

* * * * *